United States Patent [19]

Nemit et al.

[11] Patent Number: 5,325,099
[45] Date of Patent: Jun. 28, 1994

[54] MODULAR SOLID-STATE RADAR TRANSMITTER APPARATUS AND METHOD FOR PRODUCING VARIABLE WAVEFORMS

[75] Inventors: Jeffrey T. Nemit, Oxnard; Arthur Y. Okamura; John M. Milan, both of Canoga Park, all of Calif.

[73] Assignee: ITT Corporation, New York, N.Y.

[21] Appl. No.: 55,198

[22] Filed: Apr. 28, 1993

[51] Int. Cl.$^5$ ............................................. G01S 13/00
[52] U.S. Cl. .................................................. 342/202
[58] Field of Search .................. 342/201, 202; 330/43; 331/82

[56] References Cited

U.S. PATENT DOCUMENTS 4,827,267  5/1989  Shearin ............................... 342/201
5,146,616  9/1992  Tang et al. ...................... 342/201 X

OTHER PUBLICATIONS

Weil, "Efficient Spectrum Control for Pulsed Radar Transmitter", chp. 27 of *Radar Technology*, pp. 379–383, edited by Brokner.
J. R. Frost, "Phased Arrays", chp. 2 of *Radar Technology*, pp. 63–69, edited by Scanlan.

*Primary Examiner*—Mark Hellner
*Attorney, Agent, or Firm*—Arthur L. Plevy; Thomas L. Peterson

[57] ABSTRACT

A modular solid-state radar transmitter apparatus for producing waveforms whose amplitude may be varied over time. The transmitter achieves pulse modulation on either an intrapulse or pulse to pulse basis, while at the same time reducing stress on individual solid-state modules. Intrapulse modulation and pulse to pulse modulation can be produced with the disclosed modular solid-state transmitter because the number of modules and the sequence in which they are activated is selectable. These selections provide the various desired levels of transmitted power and thus effectively achieve modulation. In order to achieve this intrapulse modulation, a variable combiner is introduced whose coupling factor is coordinated with the module activations. In one embodiment, variable combining is accomplished by the use of RF switching logic for combining pairs of signals in parallel. In this case, RF switches are programmed to act as a conventional combiner when all modules are active. When a module is deactivated, the switches are set so that the active modules are connected to the output or the next stage of combining. Another embodiment uses a series approach to accomplish such variable combining. Here, when all modules are active RF switches and phase shifters are programmed for performance as in a conventional combiner. When a module is deactivated, the phase of the signals within each coupler section is adjusted by means of RF amplifier programming and phase shifters to avoid loss in the termination.

18 Claims, 6 Drawing Sheets

TAPERED WAVEFORM WITH SWITCHPOINTS

| TIME PERIOD | 1 | 2 | 3 | 4 | 5 | 6 | 7 | 8 | 9 |
|---|---|---|---|---|---|---|---|---|---|
| MODULES ON | 1,2 | 1,2,3 | 1,2,3,4 | 1,2,3 4,5 | 1,2,3 4,5,6 | 2,3,4 5,6 | 3,4 5,6 | 4,5,6 | 5,6 |

MAXIMUM ON TIME FOR A TRANSMITTER MODULE PERIODS 1-6

MODULAR SOLID-STATE RADAR TRANSMITTER APPARATUS AND METHOD FOR PRODUCING VARIABLE WAVEFORMS

FIELD OF THE INVENTION

The present invention relates to wave shaping systems for producing waveforms of variable amplitude. The invention is particularly useful for radar systems employing solid-state amplification means in the transmitter.

BACKGROUND OF THE INVENTION

Radar is used to detect and locate remote objects by the reflection of radio waves. This is accomplished by transmitting a signal of a known waveform and observing the nature of the received echo. Traditionally, the radar waveform has usually been a repetitive train of short-duration pulses all of a constant amplitude. There are certain applications for radar, however, where the production of a pulse train or waveform having varying degrees of amplitudes is advantageous. For example, tracking of objects can be improved through the use of a radar system which is capable of producing variable waveforms. This is because such systems are less susceptible to jamming and other types of Electronic Counter Measures (ECMs).

The desirability of varying a waveform's shape, also known as pulse shaping, is discussed in Chapter 27 of RADAR TECHNOLOGY by Brookner entitled "EFFICIENT SPECTRUM CONTROL FOR PULSED RADAR TRANSMITTERS". Here, waveform control or spectrum control is discussed in the context of meeting Electro-Magnetic Compatibility (EMC) requirements which are now commonly specified on radar equipment, e.g., MIL-STD-469. Techniques are considered to improve the efficiency on shaped pulses for the Traveling Wave Tube (TWT) and Klystron Tube Transmitters. With these techniques, a reasonable efficiency can be achieved, however, the complexity in the design of the power supplies for the tubes is greatly increased. This translates into a significant cost increase which has prohibited widespread implementation.

Without the help of complex and expensive power supplies, tube transmitters have significant problems when they are run in any state other than saturation. As such, they are seldom operated except in that manner. Thus, with only this single mode of operation, tube transmitters have little capability to vary the power transmissions of the pulses. One way of varying the power is to form a series or sequence of transmitter tubes called a transmitter chain. Again, such a method is prohibitive because of its cost.

The amplitudes of pulses from tube transmitters may also be controlled at IF and microwave frequencies by using a PIN diode as an attenuator or switch. For example, a PIN diode can be configured in shunt to an output RF signal so that when the diode is zero biased the signal will be transmitted with no effect; when the diode is forward biased the RF resistance decreases, shunting some of the signal to ground and thus attenuating the output signal. This is the basic reflective attenuator. The disadvantage of such a circuit is that some of the input signal will be reflected back to the input port, resulting in reduced efficiency and a poor Voltage Standing Wave Ratio (VSWR) that increases as the current is increased. In addition, the attenuation range is limited. Other methods of amplitude control for tube-type transmitters are described in MODERN RADAR TECHNIQUES edited by Scanlan, Macmillan Publishing Co. 1987, at pages 63-69, however, each has limitations similar to those methods previously described.

Because of the above-mentioned drawbacks, there has been little interest in modulating the power in a transmit pulse from a tube transmitter, either as a function of pulses in a group or on an intrapulse basis, i.e., where various amplitudes are present in a single pulse envelope. Consequently, waveform designers have concentrated on the design of coded pulses of constant amplitude and placing these constant amplitude pulses in groups which are weighted upon their receipt at the receiver. This technique can be used to control the time or spectrum sidelobes of the transmitted wave.

Because tube transmitters are seldom operated except in saturation, it has also been impossible to match the transmitted pulse waveform to that of a rectangular pulse which would provide for optimum detection; that is because a rectangular transmitted pulse requires an unrealizable rectangular filter. This unmatched condition leads to losses in the system design, since essentially some of the transmitted power is being discarded. Also, because the tube transmitters have very fast risetimes, they are vulnerable to electronic countermeasures (ECM) or jamming.

Another type of transmitter which is gaining popularity and which is replacing tube transmitters in certain applications is the solid-state transmitter. In a tube transmitter, a single thermionic device or high power microwave valve provides the final amplification for the system. Having a single power device to provide system-wide power can be disadvantageous because such devices have a limited life and failure results in complete radar system failure. With solid-state transmitters, the available architectures are significantly more diverse. They range from a set of modules which are centrally located and which emulates a tube transmitter, to a fully distributed architecture which places transmit/receive modules in an array on the antenna. Such architectures allow for the use of smaller, less stressed and less costly mass produced microwave semiconductor power devices. The very long operating life of semiconductor devices not only allows a decrease in overall radar failure rate, but provides a gradual degradation in radar performance as the semiconductor devices fail.

With the advent of solid-state transmitters, system designers have new opportunities. A typical new opportunity is more flexibility in the transmitted waveform. Additional flexibility in waveform design is available, because with modular solid-state transmitters, the number of modules which are active at a given time is selectable. This selectability is useful in order to vary the power and amplitude of the transmitted pulses.

It is, therefore, an object of the present invention to provide an apparatus and method for utilizing the added flexibility of solid-state radar transmitters to produce advanced waveforms having varying degrees of amplitude, while at the same time reducing prime power usage. The apparatus achieves significant performance advantages, such as a reduction in prime power usage. As mentioned, radar systems capable of transmitting variable waveforms provide better detection because they are less susceptible to interference from jamming and other ECMS. This invention overcomes the difficulties associated with tube transmitters through the use of a variable combiner able to achieve modulation on a pulse-to-pulse basis or an intrapulse basis. The combiner increases efficiency by controlling losses in output power when individual modules of a solid-state transmitter are activated and deactivated. Intrapulse modulation and pulse to pulse modulation can be produced with the disclosed modular solid-state transmitter because the number of modules and the sequence in which they are activated is selectable. These selections provide the various desired levels of transntitted power and thus effectively achieve modulation.

In order to achieve this intrapulse modulation, a variable combiner is introduced whose coupling factor is coordinated with the module activations. In one embodiment, variable combining is accomplished by the use of RF switching logic for combining pairs of signals in parallel. In this case, RF switches are programmed to act as a conventional combiner when all modules are active. When a module is deactivated, the switches are set so that the active modules are connected to the output or the next stage of combining. Another embodiment uses a series approach to accomplish such variable combining. Here, when all modules are active RF switches and phase shifters are programmed for performance as in a conventional combiner. When a module is deactivated, the phase of the signals within each coupler section is adjusted by means of RF amplifier programming and phase shifters to avoid loss in the termination resistors.

Finally, since the solid-state transmitter is modular, different modules can be activated during the beginning and end portions of a waveform to accomplish the intrapulse modulation. This decreases the stress on any one individual module, achieving the same result as if identical modules were activated at both the start and finish of the modulated pulse.

SUMMARY OF THE INVENTION

The present invention is a modular wave shaping apparatus for producing waveforms whose amplitude may be varied over time. The invention overcomes many of the difficulties connected with tube transmitters, by achieving pulse modulation on either an intrapulse or pulse to pulse basis, while at the same time reducing stress on individual solid-state modules.

The wave shaping apparatus generates pulses to form a variable waveform which varies in amplitude from one portion of a waveform to a next portion of the waveform. The apparatus includes: a plurality of amplifiers, wherein each of said amplifiers provides an amplified output signal at an output terminal when an input signal is applied to the amplifier input terminal; selection means coupled to each of said amplifiers for selecting predetermined groups of amplifiers from said plurality of amplifiers; and combining means coupled to said output terminal of each said amplifiers for combining said output signals from one of said predetermined group of amplifiers. The combining means may include a switching means for switching said output terminal of each of said amplifiers in and out of said combining means.

BRIEF DESCRIPTION OF THE DRAWINGS

For a better understanding of the present invention, reference is made to the following description of exemplary embodiment thereof, considered in conjunction with the accompanying drawings, in which.

DETAILED DESCRIPTION OF THE DRAWINGS

Figure 1:
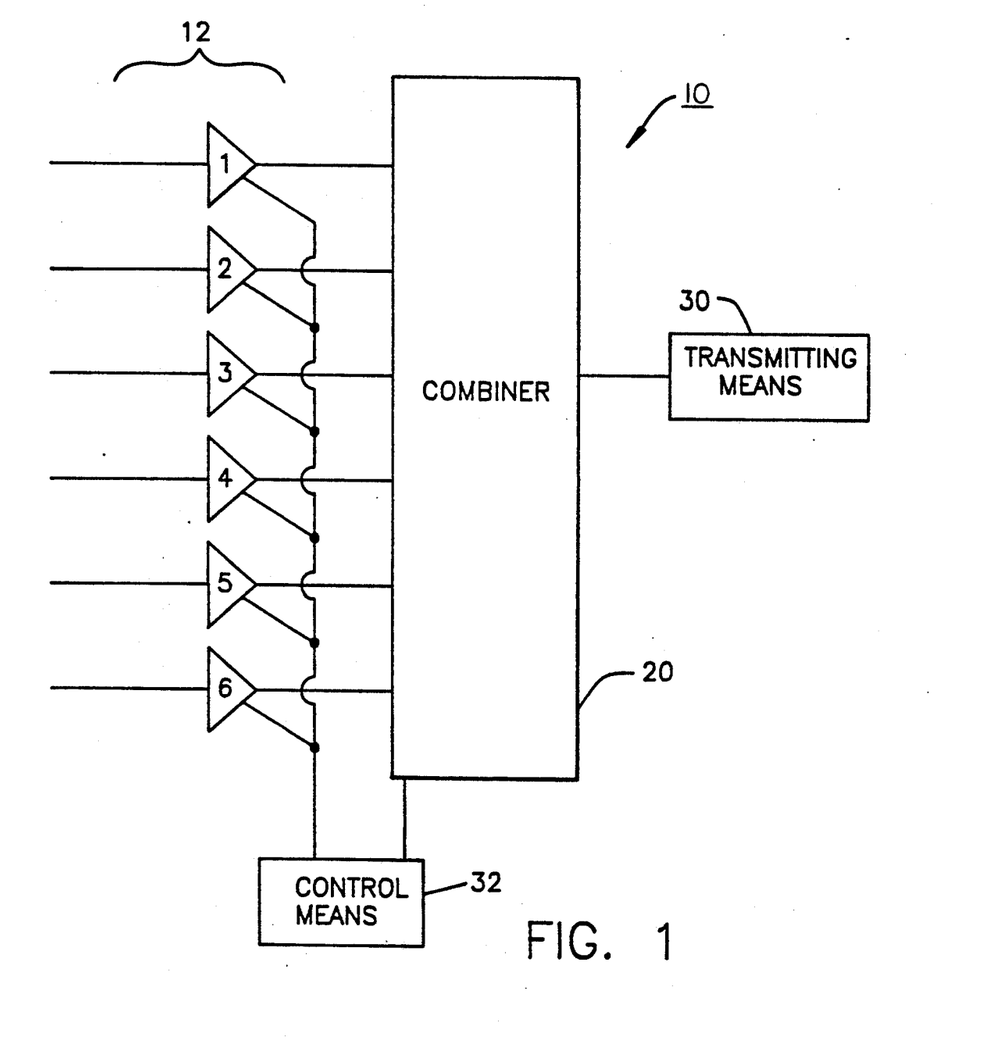
FIG. 1 is a block diagram of a modular solid-state radar transmitter according to the present invention.

Referring to FIG. 1, a block diagram of a modular solid-state transmitter 10 according to the present invention is shown. The transmitter 10 includes a plurality of amplifier modules 12, which are labeled 1-6. In the shown embodiment six amplifier modules are presented by way of example, however, any number of modules up to N modules may be employed. Each amplifier in the plurality of amplifier modules 12 are equipped to produce a signal which can be transmitted individually or as part of a composite wave. An output from each amplifier in the plurality of amplifier modules 12 is coupled to a combiner 20. The combiner 20 accepts the signals produced from the plurality of amplifier modules 12 and combines the multiple signals in order to form a composite signal or waveform. The output of the combiner 20 is coupled to a transmitting means 30, such as an antenna, which directs and transmits the signals that are combined in the combiner 20.

Notice that each amplifier module provides a separate signal to the combiner 20. Because each signal which enters the combiner 20 is derived separately from any other signal, the transmitter can be thought of as being modular. With this type of modular system, the output from the combiner 20, and thus the amplitude of an actual output signal will depend on the number of active amplifier modules which are combined in the combiner 20 at a given time.

A controlling means 32 is coupled to the combiner 20 and to each module in the plurality of amplifier modules 12. The controlling means 32 controls the manner in which the plurality of amplifier modules 12 is combined. Depending on the waveform which is to be produced, the controlling means will select various groups of amplifier modules to be combined in the combiner 20. The controlling means 32 is programmable and will also control RF switching logic contained in the combiner 20. Many examples of control circuitry may be found in the prior art. An exemplary controlling means may contain a binary decoder circuit that accepts a binary code. A binary counter can generate specific codes according to a predetermined program. Thus, each different binary code received by the decoder will cause the RF switching logic of the combiner 20 to produce a unique group selection from the plurality of amplifier modules 12.

The control means 32 may also include an activation means (not shown) for selectively activating any one of the amplifiers contained in the plurality of amplifier modules 12, individually. Circuitry for activating amplifiers is well known in the art. One example of a simple activation circuit uses a Field Effect Transistor (FET) in a switch configuration. Biasing the FET to a specific level will activate the amplifier. The activation means is coupled to each amplifier in the plurality of amplifier modules 12. In this way an amplifier module can be activated before its signal is input to the combiner 20, and alternately, an amplifier can remain active even after being deselected from the combiner.

Figure 2A:
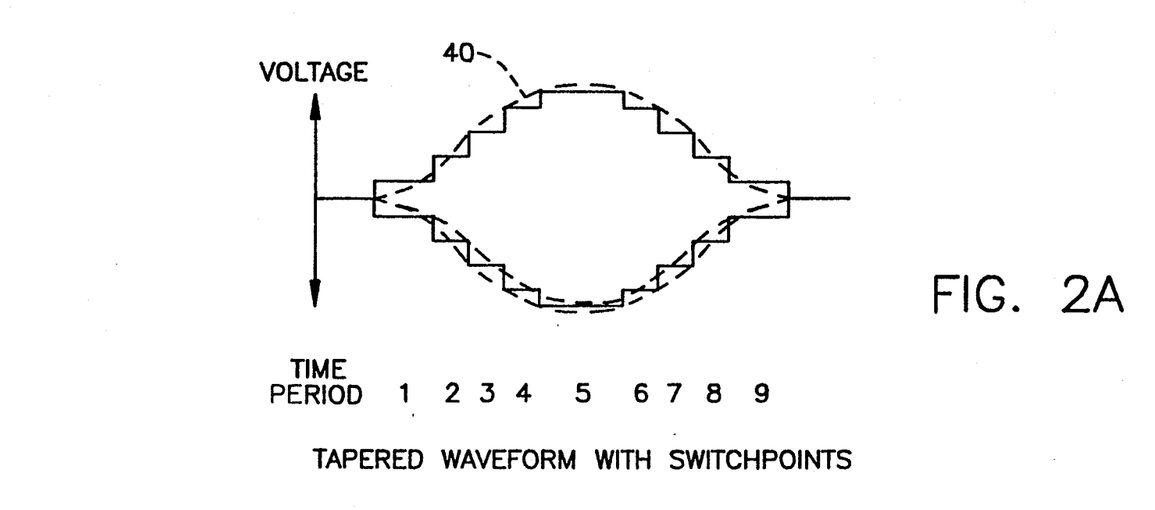
FIG. 2A is a waveform produced by the radar transmitter of the present invention which illustrates the concept of intrapulse amplitude weighting.

Referring to FIG. 2A, there is shown a tapered waveform 40 which can be produced using the modular solid-state transmitter 10 of FIG. 1. The waveform 40 also illustrates the concept of intrapulse weighting. With intrapulse weighting the strength or amplitude of a signal may change several times within a single pulse envelope. The waveform 40 of FIG. 2A actually contains a series of interconnected pulses having different degrees of amplitude. The amplitudes are varied across the pulse envelope to achieve a symmetrical taper. As mentioned, when using the modular solid-state transmitter 10, one can select the number of modules which are active at a given time. The tapered waveform 40 can be produced through the selective activation and combining of various groups of amplifier modules.

Figure 2B:
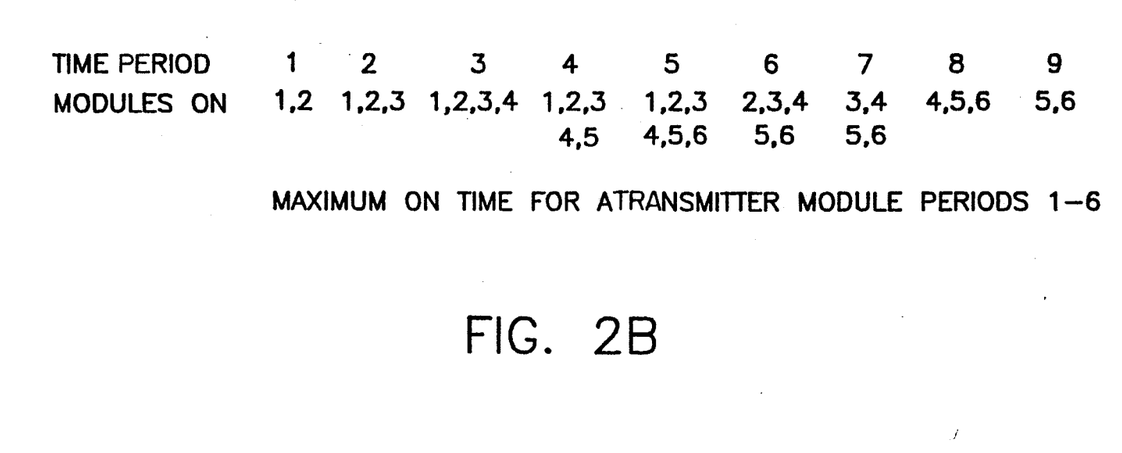
FIG. 2B is an a activation schedule for producing the waveform of FIG. 2A.

The waveform 40 of FIG. 2A contains nine periods, wherein each period has a different amplitude. The waveform 40 can be produced through the selective activation of six amplifier modules. FIG. 2B shows an activation schedule which lists the amplifier modules that are selectively activated during a given period. The activation schedule illustrates that the number of selected modules will gradually increase from the beginning of the waveform (Time Period 1) to the center of the wave (Time Period 5). Then the numbers of selected modules may gradually be decreased from the point of highest amplitude (Time Period 5) at the center of the wave, to the end of the wave (Time Period 9), where the amplitude again falls off. One can see that the number of modules and the sequence of operation are selectable to achieve the desired level of transmitted power.

The activation schedule of FIG. 2B also illustrates that different modules can be selectively activated during the first part of the symmetrically tapered waveform 40 than are activated during the latter portion. By alternating the activation of modules, the stress on any one individual module will be reduced. The schedule illustrates that module turn-on time for an individual module can be reduced below the maximum pulse width for a given waveform. As mentioned, the radar transmitter 10 which produces the tapered waveform 40 of FIG. 2A contains 6 modules and the waveform 40 contains nine time periods. The maximum turn on time for any one module, however, is six time periods. Notice that module 1 is active during time periods 1-5, whereas module 6 is active for time periods 5-9. Other modules such as modules 3 and 4, are active during the mid-portion of the tapered waveform 40, but any one module is never active for more than six consecutive time periods. This alternate activation reduces the stress on individual modules.

Figure 3:
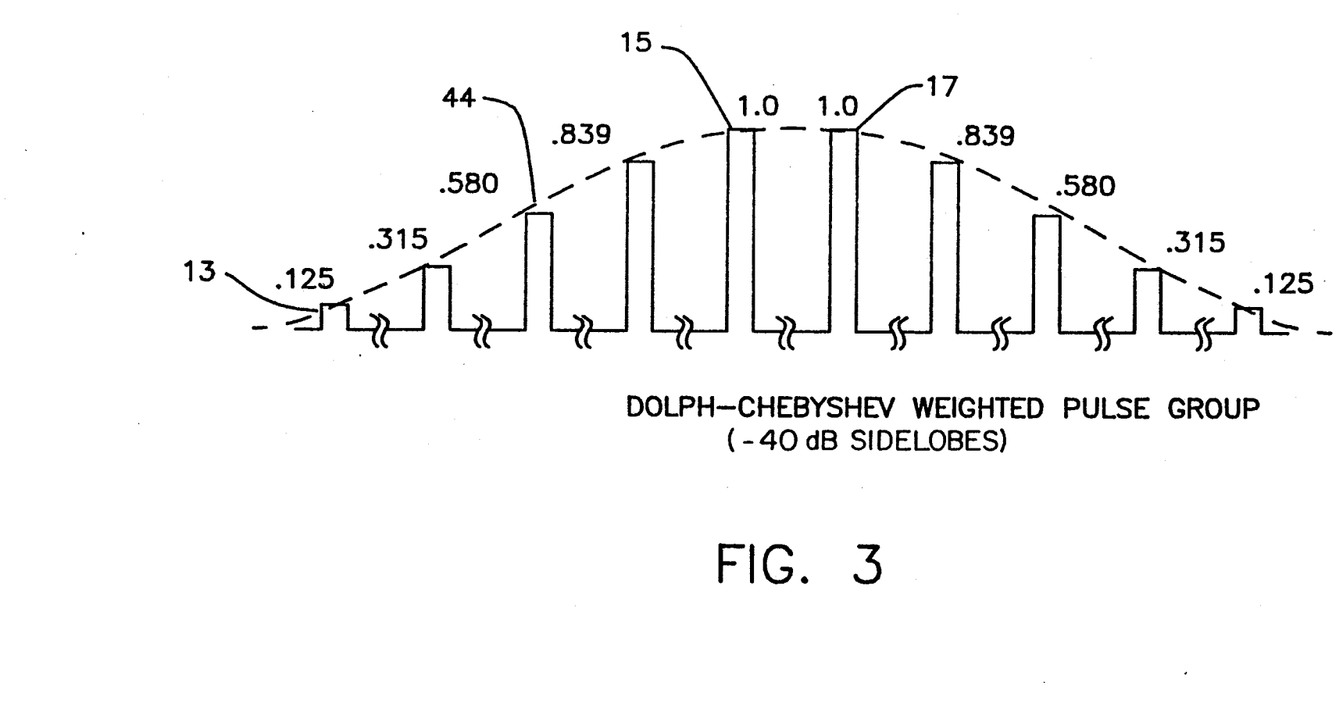
FIG. 3 is an waveform produced by the present invention which illustrates the concept of interpulse weighting.

FIG. 3 shows a waveform 44 in which interpulse weighting is applied to a pulse group of ten transmitted pulses. The waveform 44 uses a Dolph-Chebyshev weighting scheme in which various amplitude weights are assigned to different pulses of the group. The first pulse 13 has an assigned relative weight of 0.125. The assigned weights of subsequent pulses are increased by specific values until the fifth pulse 15 and sixth pulse 17 are assigned weights of unity (1). The weights of the remaining pulses are decreased in an opposite progression to form a bell shaped curve. The amplitude weighting of each pulse produces a waveform with −40 db sidelobes. In a manner similar to that described in FIG. 2, the waveform 44 of FIG. 3 can be created through the selective activation and deactivation of predetermined groups of amplifier modules. Thus, it is possible to achieve both intrapulse weighting and interpulse weighting through the use of the present invention.

As was mentioned in the background it is desirable for a radar system to produce waveforms having varying degrees of amplitude, such as those waves described in FIGS. 2 and 3. In order to produce the waveforms according to the present invention it is necessary to combine the amplified signals from the selected group of activated amplifier modules. Conventional fixed combiners may be passive or active. Classical passive combiners utilize microwave couplers in specific designs, such as the Wilkinson combiner. In the Wilkinson combiner, the signals from two input ports are added in phase at a third output port, while a fourth port is terminated. Passive combiners require balanced inputs to avoid power dissipation internal to the combiner, i.e., at the terminated port. Active combiners, on the other hand, use active devices such as amplifiers and phase shifters to achieve combining and reduce dissipation. Examples of many other prior art combiner circuits are given in *MICROWAVE SEMICONDUCTOR CIRCUIT DESIGN* by W. Alan Davis, Van Nostrand Reinhold Publishing, 1984.

All of the above conventional combiners, however, have a significant drawback, in that when a module is deactivated, the reduction in output power will be greater than the power from the deactivated module. Such an effect is a result of the additional losses caused by the unbalanced inputs which are created when a module is deactivated. In order to solve this problem, the present invention introduces a variable combiner whose coupling factor is coordinated to the number of amplifier modules selected and activated, thereby eliminating the excessive reduction in output power when a module is deactivated.

Figure 4:
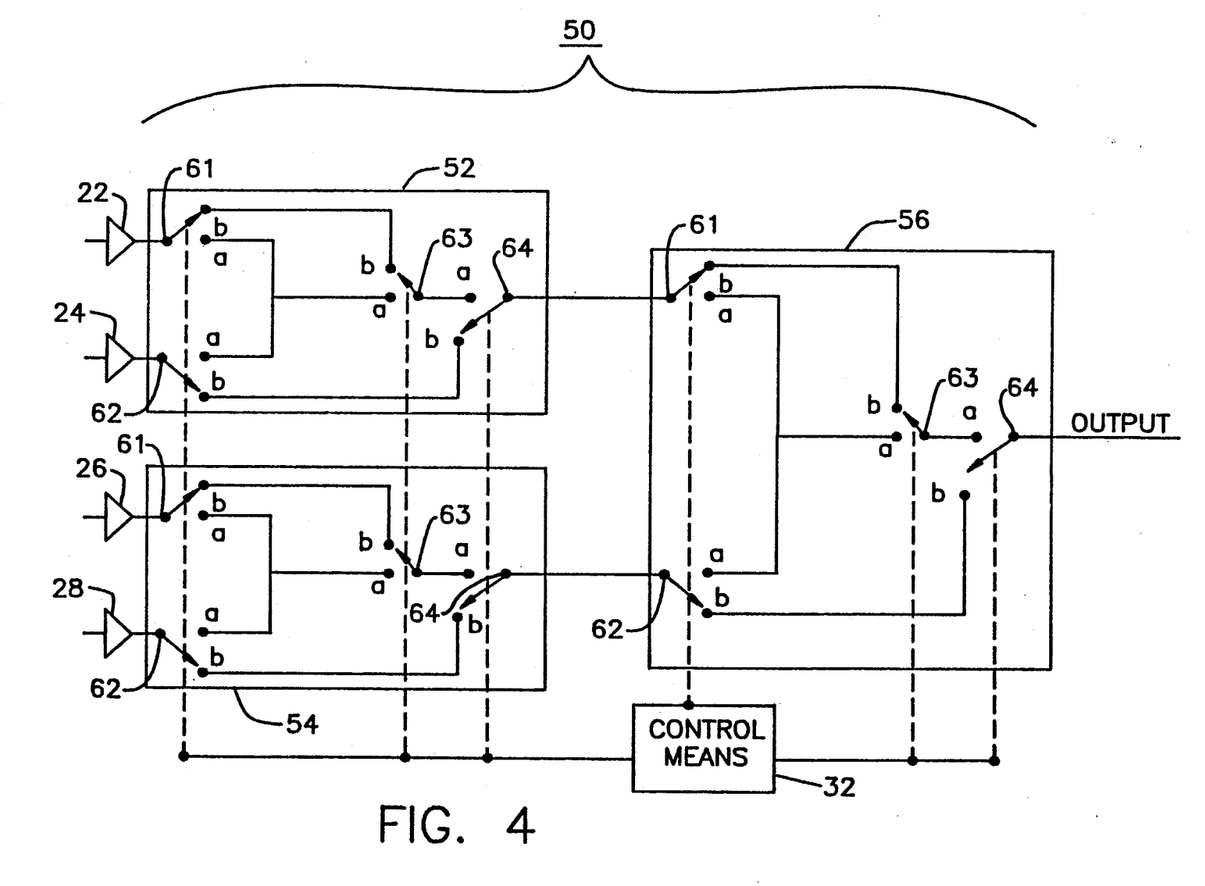
FIG. 4 first exemplary embodiment of a variable combiner according to the present invention.

Referring to FIG. 4, a first exemplary embodiment of the present invention variable combiner 50 is shown. The variable combiner 50 uses RF switching logic to achieve combining. The combiner 50 receives signals from the amplifier modules 22, 24, 26, 28 at its inputs. Four amplifier modules are shown in the present embodiment, however, as will become apparent up to N amplifier modules can be combined. Switching logic has been designed to provide alternate paths for each signal depending on how the switches are set. As discussed earlier a controlling means 32 will control the selection and activation of the amplifier modules. When all the amplifier modules 22, 24, 26, 28, are selected, the switches are set to provide a conventional combiner where the signals are combined in parallel. However, when a module is deselected, the switches are set such that only the active modules are connected to either the output of the combiner 50, or to a next stage of combining (not shown).

The combiner 50 of FIG. 4 achieves combining in pairs. The combiner 50 can be visualized as three identical sub-combiners 52, 54 and 56. The outputs of the first amplifier module 22 and the second amplifier module 24 are coupled to the inputs of the first sub-combiner 52. The outputs of the third amplifier module 26 and the fourth amplifier module 28 are coupled to the inputs of the second sub-combiner 54. The outputs of the first sub-combiner 52 and the second sub-combiner 54 are coupled to the inputs of the third sub-combiner 56. The output of the third sub-combiner 56 is coupled to an output or the next stage of combining (not shown). Each sub-combiner has switching logic and four switches which allow signals from the amplifier modules to be passed separately or combined into a single signal.

Looking more closely at the first sub-combiner 52, one can see that when the second switch 62 and fourth switch 64 are set in the "b" position, that the signal from the second amplifier module 24 will pass through the first sub-combiner 52 via connections between pole "b" of second switch 62 and pole "b" of fourth switch 64. The signal is then output to the next stage of combining, which in this case is the third sub-combiner 56. This allows the output from amplifier module 24 to pass unaffected through the first stage of combining. In a similar manner, when first switch 61 and third switch 63 are in the "b" position and fourth switch 64 is in the "a" position, the signal from first amplifier module 22 will also pass unaffected through the first sub-combiner 52. Here, one can see that there is no reduction in output power within the first sub-combiner 52, since only active modules are connected to the combiner 50. The selective activation of the switching logic keeps the inputs balanced.

Alternately, the outputs of the first amplifier module 22 and second amplifier module 24 will be combined in the first stage of combining, when all the switches of the first sub-combiner 52 are set in position "a". When the first switch 61 and second switch 62 are set in the "a" position, the signal from amplifier module 22 will flow through the first switch 61 and the signal from the second amplifier module 24 will flow through the second switch 62 where they will be combined as they reach pole "a" of the third switch 63. In order for the signal to continue to the next stage of combining, the third switch 63 and fourth switch 64 must also be set in position "a". This allows the signal to proceed through pole "a" of the third switch 63 and through pole "a" of the fourth switch 64 to the input of the next stage of combining. Once again, the controlling means 32 controls the switching logic to keep the inputs of the combiner 50 balanced with only active modules, so that there is no reduction in output power when a module is activated or deactivated.

The structure of the first sub-combiner 52 and the second sub-combiner 54 are identical. Therefore, the operation of second sub-combiner 54 is identical to the above-described operation for first sub-combiner 52, with the exception of different amplifier modules at the inputs of second sub-combiner 54. The architecture of the third sub-combiner 56 is also identical to that of the first sub-combiner 52 and the second sub-combiner 54. The only difference being that the two inputs of the third sub-combiner 56 are outputs from previous stages of combining, i.e., the first sub-combiner 52 and the second sub-combiner 54, rather than outputs of amplifier modules. The operation of the third sub-combiner 56 is identical to that of the first sub-combiner 52 in that through appropriate switch selection, the signals provided at either of its inputs can be passed through the sub-combiner 56 unaffected or they can be combined to form a composite signal.

The architecture described in FIG. 4 is expandable up to N pairs of amplifier modules. Any particular Radio Frequency Amplifier (RFA) and any quantity of RFAs may be selectively activated or deactivated by the controlling means 32 without suffering excessive loss in signal power due to the power dissipation of the load resistance when a signal is missing or altered in phase or amplitude. The outputs of these modules are then combined in the variable combiner 50 in order to produce an advanced waveform having varying degrees of amplitude.

Figure 5:
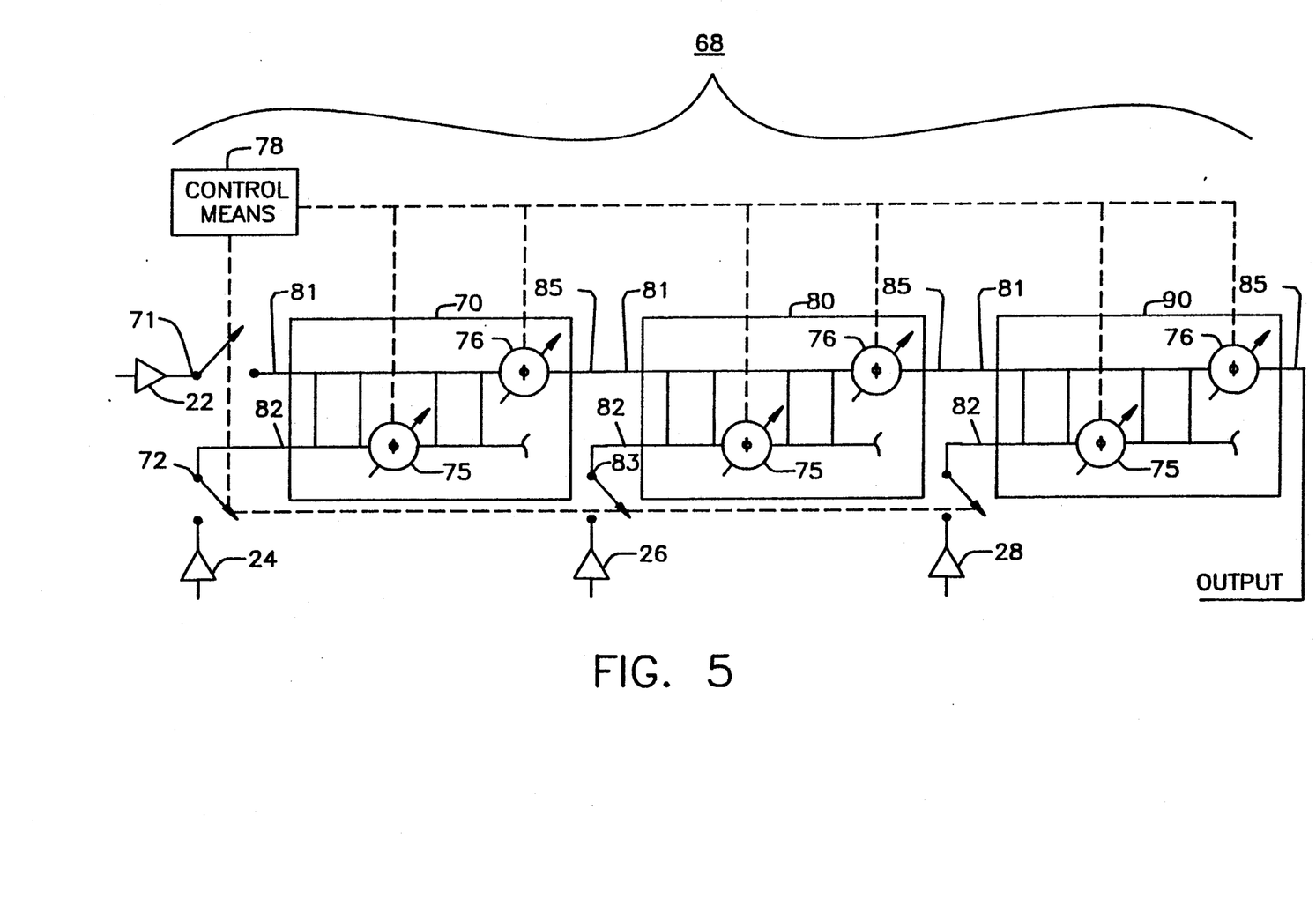
FIG. 5 is a second exemplary embodiment of a variable combiner according to the present invention.

Referring to FIG. 5, a second exemplary embodiment of a combiner 68 according to the present invention is shown, wherein a series approach to combining is illustrated. Three identical coupler sections 70, 80 and 90 are shown wherein each coupler section contains two associated phase shifters 75, 76. A first input 81 of each coupler section is coupled to the output 85 of an amplifier module through a switch. A second input 82 of each coupler section (except for the very first section) is connected to the output 85 of a previous stage of combining.

The combiner 68 of FIG. 5 achieves low loss combining using a controlling means 78 to control RF switching logic of the combiner 68 and to adjust the phase shifters 75, 76 of each coupler section, thereby avoiding loss in the termination resistors (not shown). The controlling means 78 is similar to the controllers previously described. Depending on the group of amplifier modules which is selected, the controlling means 78 dictates the behavior of the switching logic and the phase shifters 75, 76. In this embodiment, when all amplifiers are selected, the phase shifters 75, 76 are set to zero and the combiner 68 performs as a classical combiner wherein the signals from all active modules are combined in phase. When a module is deselected the two associated phase shifters 75, 76 following a deactivated module are readjusted to provide the required phase shift in the input and coupling legs. This ensures that the power adds in the desired coupler section and is not dissipated in the termination.

As can be seen in FIG. 5, the first amplifier module 22 is coupled to the first input 81 of the first coupler section 70 via the first switch 71. The second amplifier module 24 is coupled to the second input 82 of the first coupler section 70 via the second switch 72. The first coupler section 70 has a first associated phase shifter 75 and a second associated phase shifter 76.

The second input 82 of the second coupler section 80 is coupled to third amplifier module 26 via the third switch 83. The first input 81 of the second coupler section 80 is connected to the output 85 of the first coupler section 70. The second coupler section 80 has a first associated phase shifter 75 and a second associated phase shifter 76. The structure of the third coupler section 90, is identical to that of the second coupler section 80, with the exception that the output 85 of the third coupler section 90 is coupled to an outputting means (not shown).

When an amplifier module of the combiner 68 is selected, the associated switch leading to the corresponding coupler section is placed in the closed position. For example, when the first amplifier module 22 is selected, the first switch 71 associated with the first amplifier module 22 is closed. This allows the amplified signal from amplifier module 22 to flow into the first coupler section 70. When all the amplifier modules 22, 24, 26, 28 are selected and activated, the combiner 68 will function as a classical combiner; that is the associated phase shifters 75, 76 in each coupler section 70, 80, 90 are set to zero and the two signals entering each coupler section will be combined in phase. In this case, when all the amplifier modules are selected, the signal from the first amplifier module 22 and the second amplifier module 24 will be combined in the first coupler section 70. The combined signal from the first coupler section 70 will then travel to the input 81 of the second coupler section 80, where it will be combined with the signal from the third amplifier module 26. This sequence continues in the third coupler section 90, where the combined signal from the second coupler section 80 is combined with the signal from the fourth amplifier module 28. The final composite signal can then be transmitted.

When an amplifier module is deselected, the controlling means 78 causes the associated phase shifters 75, 76 in the corresponding coupler section to readjust the phase of the signal traveling through that section. In this way output power will not be lost because of the unbalanced inputs created as a result of the deactivation. For example, if the second amplifier module 24 of coupler section 70 is deselected, the first associated phase shifter 75 and second associated phase shifter 76 following amplifier module 24 are readjusted to provide the required phase shift in the input and coupling legs of coupler section 70. This ensures that the power adds in the desired coupling section 70 and is not dissipated in the termination.

The combiner 68, as with the combiner 50 described in FIG. 4, can be expanded up to N coupler sections. Thus, any number of modules can be controlled in the above manner. One can see that by utilizing either of the two approaches discussed in conjunction with FIGS. 4 and 5, that any number of modules can be selected and their signals combined. By varying the selection of such modules over time, an advanced waveform having a gradual taper of varying amplitudes can be easily created.

Another problem addressed by the present invention is the phase instability of an amplifier's output signal during initial activation. For example, when a class C amplifier is activated, its phase is unstable for a period of time, which is on the order of 100 nsec. The present invention discloses an apparatus and method which utilizes PIN diodes for input and output controls to minimize contributions to the output pulse during phase stabilization. PIN diodes employ a wide intrinsic region which permits high power handling capability and offers an impedance which is controllable by lower frequencies or DC bias. The PIN diodes have proved useful for microwave switches,, modulators and protectors. In changing from reverse to forward bias the PIN diode changes electrically from a small capacitance to a large conductance, which approximates a short circuit.

Figure 6:
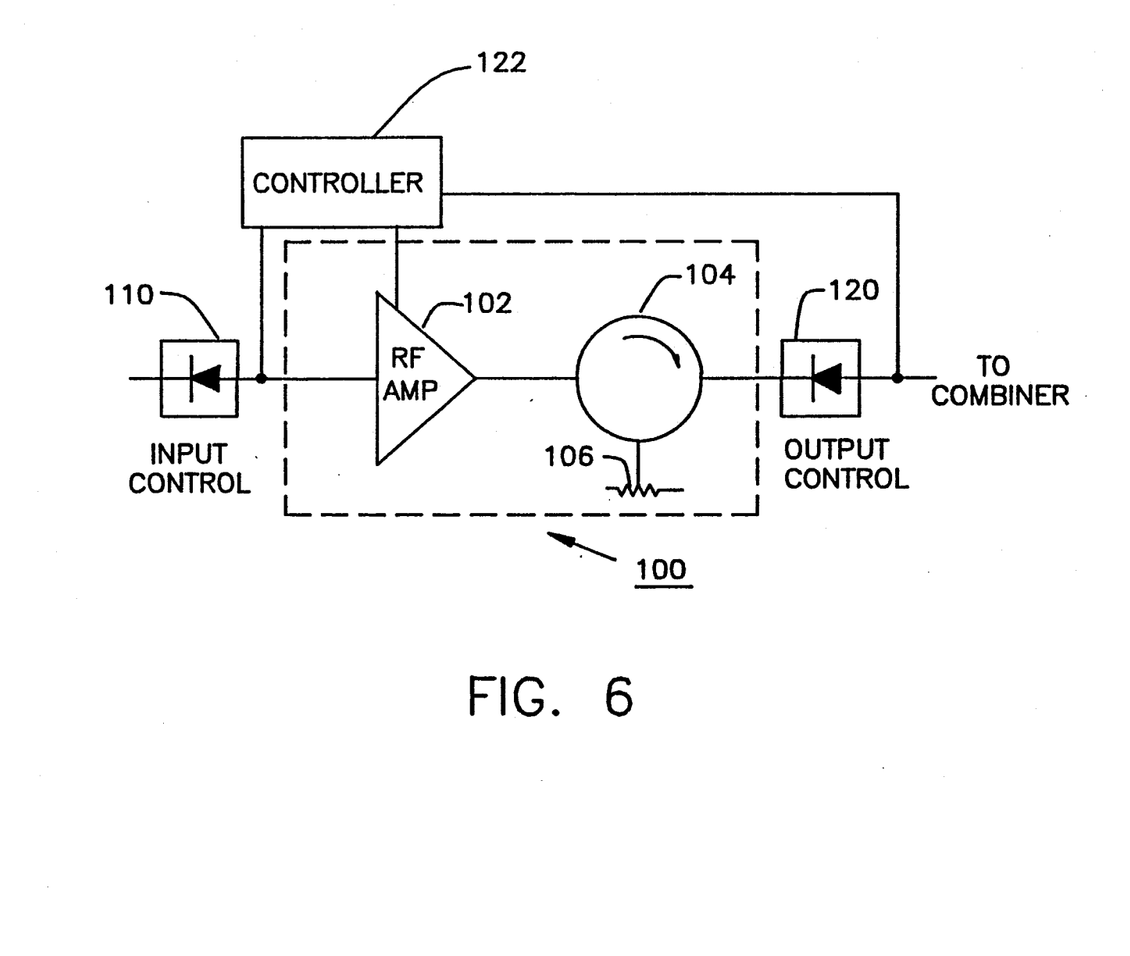
FIG. 6 is an exemplary amplifier module according to the present invention which minimizes phase instabilities during initial activation of an amplifier.

Referring to FIG. 6, an exemplary amplifier module 100 according to the present invention is shown. The amplifier module 100 contains input and output controls made from PIN diodes. The amplifier module 100 includes an RF amplifier 102 whose output is coupled to a circulator 104. The circulator 104 is coupled to impedance element 106 which provides a dummy load. A first PIN diode 1 10 has its anode coupled to the input of the amplifier module 100 and a second PIN diode 120 has its cathode coupled to the output of the circulator 104, which is also the output of the amplifier module 100. The PIN diodes and amplifier 102 are coupled to a controller 122.

Phase amplitude, and spectrum stabilization is accomplished utilizing the PIN diodes 110, 120 as input and output controls. In order to stabilize the amplifier module 100, the amplifier 102 is activated by the controller 122. The first PIN diode 110 which acts as an input switch is forward biased by the controller 122 to impress signal power (from a source not shown) on the amplifier module 100. The amplifier 102 will then begin to output an amplified signal. At the same time the second PIN diode 120, which acts as an output switch, must be reverse biased to reflect the amplified signal back through the circulator 104. The circulator 104 circulates the signal so that the reflected power is dissipated in the impedance element 106 during stabilization. After the initial turn on, and after a predetermined time where the phase amplitude, and spectrum have stabilized (turn-on transients have damped-out), the second PIN diode 120 is forward biased by the controller 122 in older that the amplified signal may reach the input of the combiner (not shown), where it is added to the power of the other modules.

Thus, the present invention discloses a radar transmitter apparatus and method for achieving intrapulse and interpulse weighting of radar transmissions using solid-state amplifier modules. The proposed transmitter includes a variable combiner which controls the losses of output power from the unbalanced inputs that are created when a module is deactivated. The control of power losses leads to increased efficiency for the radar system. The design of the radar transmitter and variable combiners is less complex and more cost efficient than other methodologies found in the prior art. A device and method for stabilizing the phase of newly activated amplifier modules have also been introduced. The above scheme eliminates the unwanted contribution from an amplifier module whose phase has not yet stabilized.

It will be understood that the present invention radar transmitters and combiners described herein are merely exemplary and that a person skilled in the art may make many variations and modifications to the described embodiments. As such, the invention is not limited solely to the embodiments described above, but may be modified within the scope of the following claims.

What is claimed is:

1. A wave shaping apparatus for generating pulses to form a variable waveform which varies in amplitude from one portion of said waveform to a next portion of said waveform, said apparatus comprising:

a plurality of amplifiers, wherein each of said amplifiers provides an amplified output signal at an output terminal when an input signal is applied to the amplifier input terminal:

selection means coupled to each of said amplifiers for selecting predetermined groups of amplifiers from said plurality of amplifiers;

combining means coupled to said output terminal of each said amplifiers for combining said output signals from said predetermined groups of amplifiers, wherein said combining means further includes switching means for switching said output terminal of each of said amplifiers in and out of said combining means, said switching means being coordinated with said selection means, whereby only said output signals from said predetermined groups of amplifiers selected by said selection means are switched into said combining means, and wherein said combining means combines said output signals from said plurality of amplifier modules in pairs, said combining means having at least one stage of combining for combining said pairs of output signals in parallel, wherein each said stage includes:

a first input port coupled to said output terminal of one of said amplifiers in said plurality of amplifiers;

a second input port coupled to said output terminal of a second one of said amplifiers in said plurality of amplifiers; and an output port, wherein said switching means can be set in order to pass said output signal at said first input port unaffected to said output port; wherein said switching means can be reset in order to pass said output signal at said second input port unaffected to said output port; and wherein said switching means can be reset in order to combine said output signal from said first input port with said output signal from said second input port in order to form a composite signal.

2. The apparatus of claim 1, further including an outputting means for transmitting said output signals combined in said combining means, wherein said output signals are used in a radar system.

3. The apparatus of claim 2, wherein said outputting means is an antenna or, or other transmitting device.

4. The apparatus of claim 1, further including an activation means for selectively activating any number of amplifiers from said plurality of amplifiers.

5. The apparatus of claim 4, wherein said activation means further includes a means for alternating said amplifiers that are selectively activated to thereby reduce stress on individual amplifiers.

6. A wave shaping apparatus for generating pulses to form a variable waveform which varies in amplitude from one portion of said waveform to a next portion of said waveform, said apparatus comprising:

a plurality of amplifiers, wherein each of said amplifiers provides an amplified output signal at an output terminal when an input signal is applied to the amplifier input terminal:

selection means coupled to each of said amplifiers for selecting predetermined groups of amplifiers from said plurality of amplifiers;

combining means coupled to said output terminal of each said amplifiers for combining said output signals from said predetermined groups of amplifiers, wherein said combining means further includes switching means for switching said output terminal of each of said amplifiers in and out of said combining means, said switching means being coordinate with said selection means, whereby only said output signals from said predetermined groups of amplifiers selected by said selection means are switched into said combining means, wherein said combining means includes a plurality of coupler sections, with at least a first coupler section and a next coupler section connected in series, wherein each said coupler section from said plurality of coupler sections includes: a plurality of input ports; phase shifting means; and an output port; and wherein at least one of said amplifiers from said plurality of amplifiers is coupled to one of said plurality of input ports from each said coupler section, and wherein said output port of said first coupler section is coupled to one of said plurality of input ports of said next coupler section.

7. The apparatus of claim 6, wherein said output signal from each said amplifier in said plurality of amplifiers has a predetermined phase, whereby selecting said predetermined groups of amplifiers causes said phase shifting means to readjust said predetermined phase of said output signals in at least one of said coupler sections.

8. The apparatus of claim 6, further including an outputting means for transmitting said output signals combined in said combining means, wherein said output signals are used in a radar system.

9. The apparatus of claim 8, wherein said outputting means is an antenna or, or other transmitting device.

10. The apparatus of claim 6, further including an activation means for selectively activating any number of amplifiers from said plurality of amplifiers.

11. The apparatus of claim 10, wherein said activation means further includes a means for alternating said amplifiers that are selectively activated to thereby reduce stress on individual amplifiers.

12. A wave shaping apparatus for generating pulses to form a variable waveform which varies in amplitude from one portion of said waveform to a next portion of said waveform, said apparatus comprising:

a plurality of amplifiers, wherein each of said amplifiers provides an amplified output signal at an output terminal when an input is applied to the amplifier input terminal;

selection means coupled to each of said amplifiers for selecting predetermined groups of amplifiers from said plurality of amplifiers;

combining means coupled to said output terminal of each said amplifiers for combining said output signals from said predetermined groups of amplifiers, wherein each amplifier in said plurality of amplifiers contains control circuitry for stabilizing the phase, amplitude and spectrum of said output signal of each said amplifier when said amplifier is first activated, said control circuitry including:

a circulator having an impedance element, said circulator having an input and an output, said input of said circulator coupled to said output terminal of said amplifier;

a first PIN diode for providing input control to said amplifier, said first PIN diode having an anode end and a cathode end, wherein said cathode end of said first PIN diode is coupled to said input terminal of said amplifier;

a second PIN diode for providing output control, said second PIN diode having an anode end and a cathode end, said anode end of said second PIN diode coupled to said output of said circulator;

biasing means for biasing said first and second PIN diode; whereby said first PIN diode is forward biased when said amplifier is first activated in order to impress said input signal on said amplifier and said second PIN diode is reverse biased in order to reflect said output signal back to said circulator, whereby said impedance element dissipates said output signal; and whereby said second PIN diode is forward biased after said phase of said output signal has stabilized in order that said output signal may reach said combining means.

13. A method for creating a variable waveform for use in a radar system, said variable wave form having varying degrees of amplitude, said method comprising the steps of:

providing a plurality of amplifiers wherein each of said amplifiers generates an amplified output signal at an output terminal when an input signal is applied to the amplifier input terminal;

selecting predetermined groups of amplifiers from said plurality of amplifiers;

stabilizing the phase of said output signals of said selected predetermined groups of amplifiers, wherein each amplifier in said plurality of amplifiers includes stabilization circuitry, wherein said stabilization circuitry includes a first PIN diode, a second PIN diode, a circulator having an input and an output, said circulator also including an impedance element, said input of said circulator coupled to said output terminal of said amplifier, said output of said circulator coupled to the cathode of said second PIN diode, and the anode of said first PIN diode coupled to an input of said amplifier, wherein said step of stabilizing said output signals includes the steps of:

forward biasing said first PIN diode in order to impress said input signal on said amplifier;

reverse biasing said second PIN diode at the same time said first PIN diode is forward biased thereby reflecting said output signal back to said circulator to be dissipated by said impedance element;

forward biasing said second PIN diode after said phase of said output signal has stabilized in order that said output signal may be combined; and combining said output signals of said selected predetermined groups of amplifiers to provide said variable waveform.

14. The method of claim 13, further including the step of transmitting said output signals from said selected predetermined groups of amplifiers after said step of combining.

15. The method of claim 13, further including the step of:

switching said output terminals of only said selected predetermined groups of amplifiers to a combining means prior to said step of combining.

16. The method of claim 15, wherein said combining means includes phase shifting means, said method further including the step of:

adjusting said phase shifting means after said step of switching, thereby producing a phase shift in said output signals of said selected predetermined groups of amplifiers.

17. The method of claim 13, further includes the step of:

activating said amplifiers in said selected predetermined groups of amplifiers prior to said step of combining.

18. The method of claim 17, wherein said step of activating said amplifiers further includes the step of:

alternating the activation of said amplifiers to thereby reduce stress any one amplifier in said plurality of amplifiers.

* * * * *

UNITED STATES PATENT AND TRADEMARK OFFICE
CERTIFICATE OF CORRECTION

PATENT NO. : 5,325,099

DATED : June 28, 1994

INVENTOR(S) : Jeffrey T. Nemit et al.

It is certified that error appears in the above-identified patent and that said Letters Patent is hereby corrected as shown below:

In Claim 6, Column 11, Line 50 delete "coordinate" and insert --coordinated--.

Signed and Sealed this

Thirteenth Day of September, 1994

Attest:

BRUCE LEHMAN

Attesting Officer

Commissioner of Patents and Trademarks